United States Patent [19]
Geerlings

[11] Patent Number: 5,877,640
[45] Date of Patent: Mar. 2, 1999

[54] DEVICE FOR DERIVING A CLOCK SIGNAL FROM A SYNCHRONIZING SIGNAL AND A VIDEORECORDER PROVIDED WITH THE DEVICE

[75] Inventor: Jurgen H. T. Geerlings, Tadley, United Kingdom

[73] Assignee: U.S. Philips Corporation, New York, N.Y.

[21] Appl. No.: 605,544

[22] Filed: Feb. 20, 1996

[30] Foreign Application Priority Data

Feb. 20, 1995 [EP] European Pat. Off. .............. 95200403

[51] Int. Cl.[6] .............................. H03K 5/22; H03L 7/199
[52] U.S. Cl. .......................... 327/141; 327/142; 327/154; 327/155; 327/156; 327/160
[58] Field of Search .................................... 327/141, 142, 327/154, 155, 156, 160

[56] References Cited

U.S. PATENT DOCUMENTS

| | | | |
|---|---|---|---|
| 3,573,634 | 4/1971 | Rachel | 328/63 |
| 3,701,953 | 10/1972 | Lubarsky, Jr. | 328/155 |
| 5,012,198 | 4/1991 | Okada et al. | 328/155 |
| 5,019,907 | 5/1991 | Murakoshi et al. | 358/158 |
| 5,043,966 | 8/1991 | Zwaans | 369/47 |
| 5,457,428 | 10/1995 | Alder et al. | 331/1 A |
| 5,635,875 | 6/1997 | Kusakabe | 331/1 A |

*Primary Examiner*—Timothy P. Callahan
*Assistant Examiner*—An T. Luu
*Attorney, Agent, or Firm*—Edward W. Goodman

[57] ABSTRACT

A device for deriving a clock signal having a specific frequency, from an electrical signal, for example, a video signal, the device including an input terminal (1) for receiving the synchronizing signal; a phase comparator (5) having a first input coupled to the input terminal, a second input and an output; a voltage controlled oscillator (15) having an input coupled to the output of the phase comparator, and an output; a counter (23) having a first input coupled to the output of the voltage controlled oscillator, a second input for receiving a preset control signal, and an output coupled to the second input of the phase comparator; a preset control signal generator (30) having an input coupled to the input terminal, and an output coupled to the second input of the counter, the counter being adapted to set its count value to a preset value in response to the preset control signal applied to its preset control signal input. The preset control signal generator includes a window signal generator (48) for determining a window signal in response to a specified count value in the counter; and a detector (34, 36) for detecting whether at least one edge in the synchronizing signal falls outside a time interval defined by the window signal, and for generating the preset control signal in response to this detection, the detector having an input coupled to the input of the preset control signal generator and an output coupled to the output of the preset control signal generator.

4 Claims, 2 Drawing Sheets

DEVICE FOR DERIVING A CLOCK SIGNAL FROM A SYNCHRONIZING SIGNAL AND A VIDEORECORDER PROVIDED WITH THE DEVICE

BACKGROUND OF THE INVENTION

1. Field of the Invention

The invention relates to a device for deriving a clock signal having a specific frequency from a synchronizing signal derived from an electrical signal, for example, a video signal, the device comprising an input terminal for receiving the synchronizing signal, a phase comparator having a first input coupled to the input terminal, a second input and an output, a voltage controlled oscillator having an input coupled to the output of the phase comparator, and an output, counter means having a first input coupled to the output of the voltage controlled oscillator, a second input for receiving a preset control signal, and an output coupled to the second input of the phase comparator, preset control signal generator means having an input coupled to the input terminal and an output coupled to the second input of the counter means, the counter means being adapted to set its count value to a preset value in response to the preset control signal applied to its preset control signal input, and to a videorecorder provided with the device.

2. Description of the Related Art

A device as defined in the opening paragraph is known from U.S. Pat. No. 5,043,966 (PHN 12.569) and enables the derivation of a clock signal from a synchronizing signal that is affected with time-base errors. In the known device, the head switch impulse is used to derive the preset control signal.

SUMMARY OF THE INVENTION

An object of the invention is to provide a different solution for the derivation of the preset control signal.

This object is achieved in a device according to the opening paragraph, which, in accordance with the invention, is characterized in that the preset control signal generator means comprises window signal generator means for determining a window signal in response to a specified count value of the counter means, detector means for detecting whether at least one edge in the synchronizing signal falls outside a time interval defined by the window signal and for generating said preset control signal in response to said detection, said detector means having an input coupled to the input of the preset control signal generator means and an output coupled to the output of said preset control signal generator means.

The invention is based on the recognition that devices for deriving a clock signal are generally accommodated in an integrated circuit (IC). In some situations, the head switch signal is not available in such ICs. In that case, it is not possible to realize a device as shown in the prior art reference given above.

In accordance with the invention, use has been made of only the synchronizing signal itself and the counter in order to realize a device which is less sensitive to time-base errors.

A preferred embodiment of the device is characterized in that the preset control signal generator means further comprises preset value determining means for generating a preset value which has a relation with the length of an impulse in the synchronizing signal, an output of the preset value determining means being coupled to a preset value input of the counter means.

The device is preferably of use in a videorecorder, where the clock signal can be derived from the horizontal line synchronization signal present in the video signal reproduced.

BRIEF DESCRIPTION OF THE DRAWINGS

These and other aspects of the invention will be apparent from and elucidated with reference to the embodiments described hereafter. In the drawings

DESCRIPTION OF THE PREFERRED EMBODIMENTS

Figure 1:
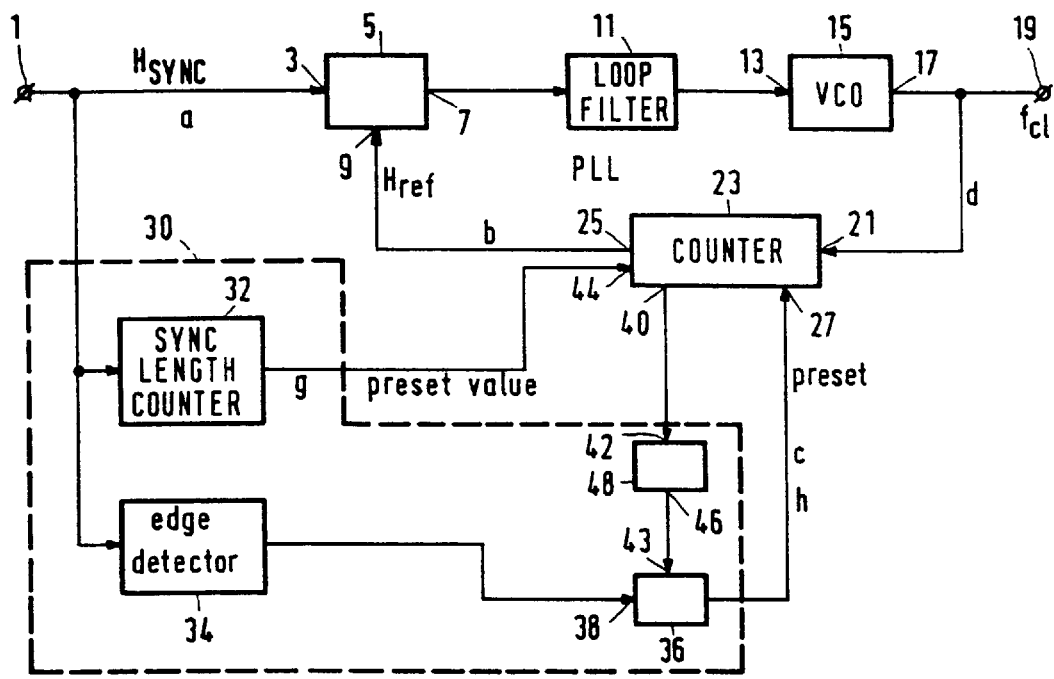
FIG. 1 shows an embodiment of the device.

FIG. 1 shows an embodiment of the device in accordance with the invention. The device comprises an input terminal 1 for receiving the synchronizing signal $H_{sync}$, which is supplied to a first input 3 of a phase comparator 5. The synchronizing signal $H_{sync}$ may have been derived from a video signal by detecting the horizontal sync pulses in the video signal. To that purpose, a sync detector (not shown) is available that can detect valid sync pulses in a video signal, e.g., using a counter. The counter is started upon the occurrence of a negative going edge in the sync signal and stops upon the occurrence of a positive going edge in the sync signal. If the count value substantially equals the nominal length of the sync pulse, then it is decided that a valid sync pulse is present.

The phase comparator 5 has an output 7 which is coupled to an input 13 of a voltage controlled oscillator 15 via a loop filter 11. The oscillator 15 generates a clock signal having a frequency $f_{cl}$ in response to the signal applied to its input 13, which clock signal is supplied to an output 17. The output 17 of the oscillator 15 is coupled to an output terminal 19 of the device and to an input 21 of a counter 23. An output 25 of the counter 23 is coupled to a second input 9 of the phase comparator 5. The counter 23 has a preset input 27 for receiving a preset control signal.

The device further comprises a preset control signal generator unit 30, which comprises a synchronization signal length detector (counter) 32, an edge detector 34, a window signal generator 48 and a gate 36. The input terminal 1 is coupled to inputs of the detectors 32 and 34. An output of the detector 32 is coupled to a preset value input 44 of the counter 23. The edge detector 34 has an output which is coupled to a first input 38 of the gate 36. An output 40 of the counter 23 is coupled to an input 42 of the window signal generator 48, an output of which is coupled to a second input 43 of the gate 36.

The counter 23 is a modulo-N counter and counts recurrently from count value '0' to 'N−1'. The $H_{ref}$ signal is made, by division of $f_{cl}$, to have a period of $N/f_{cl}$. When in lock, $f_{Hr}$ equals $f_{Hs}$, where $f_{Hs}$ is the frequency of the $H_{sync}$ signal and $f_{Hr}$ is the frequency of the $H_{ref}$ signal. Substitution of $f_{Hr}$ gives the relation between the clock frequency $f_{cl}$ and the line frequency $f_{Hs}$. For example, with a PAL video signal, $f_{Hs}$=15,625, and N=864, the clock frequency $f_{cl}$ will be equal to 13.5 MHz ($f_{cl}=N*f_{Hs}$).

Figure 2:
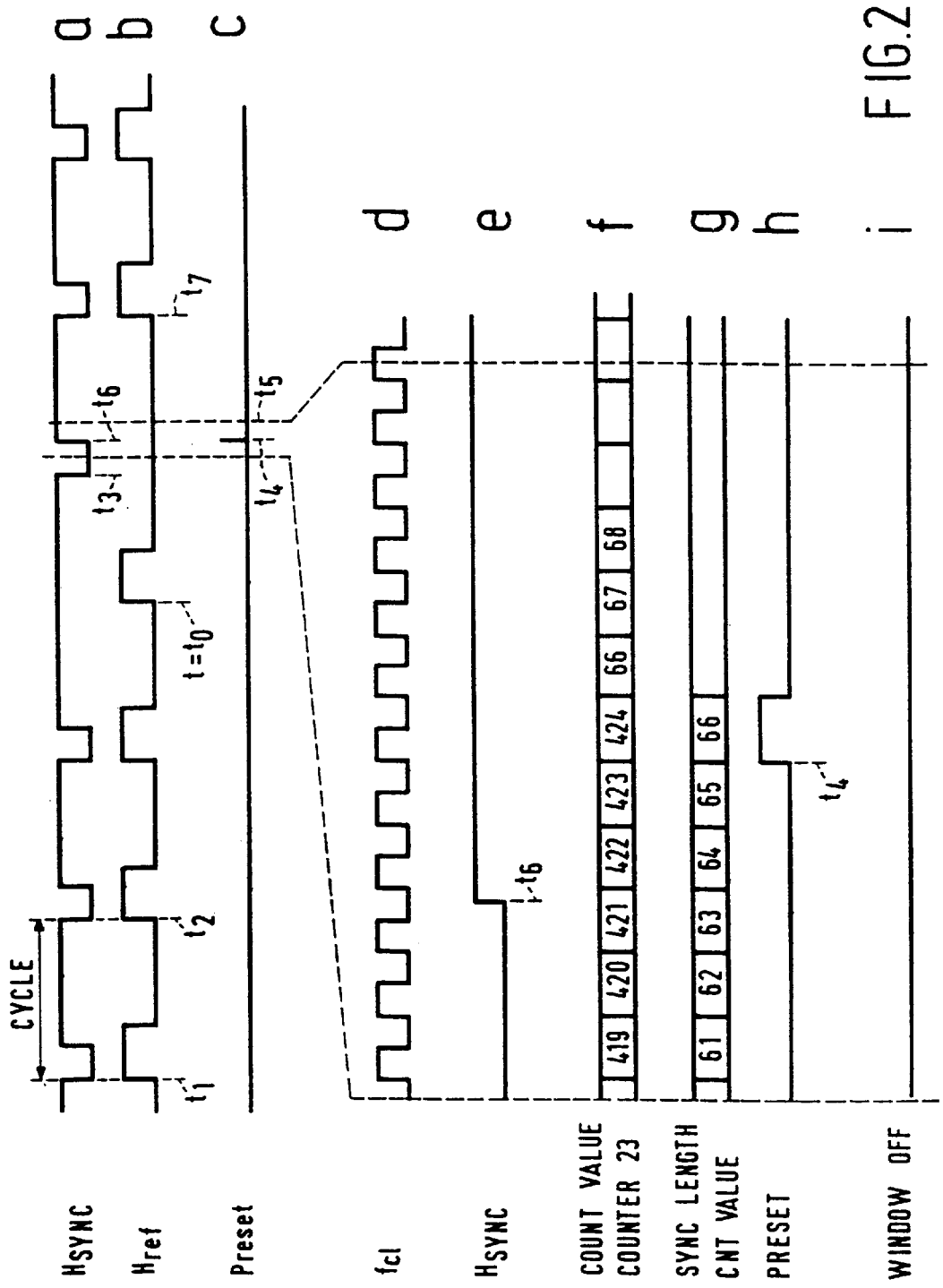
FIG. 2 shows various signals occurring in the device.

FIG. 2 shows various signals as a function of time, occurring in the device of FIG. 1 when in function. Signal (a) in FIG. 2 is the synchronizing signal $H_{sync}$ that is received at the input terminal 1. Signal (b) in FIG. 2 is the signal $H_{ref}$ that is generated by the counter 23 and which is supplied to the input 9 of the comparator 5. Signal (c) is the preset signal generated by the preset control signal generator 30 and supplied to the input 27 of the counter 23.

When the phase-locked loop, comprising the elements 5, 11, 15 and 23, is in lock, pulses $H_{ref}$ are generated by the counter 23, see the signals (a) and (b) in FIG. 2 for time instants prior to $t_0$. In the cycle shown in FIG. 2 between time instants $t_1$ and $t_2$, the counter 23 starts at a count value 'zero' at time instant $t_1$ and counts to the value N(=863, see the example above), which count value is reached at the time instant $t_2$. The width of the $H_{ref}$ pulses is more or less arbitrary. The width of the pulses $H_{sync}$ is, in the nominal situation, 4.7 μs. This corresponds to 64 clock counts of the counter 23, when running at a clock frequency $f_{cl}$ of 13.5 MHz, see the example above. The counter 23 supplies an output signal at an output 40 indicating that the count value has become 'zero', that is, at the instant of the rising edge in the $H_{ref}$ signal. This output signal is supplied to the window signal generator 48 which generates the window signal that starts at the rising edge of the $H_{ref}$ signal. The window signal is longer than the width of the pulses $H_{sync}$. This window signal is generated at the output 46 and is supplied to the gate 36. When a positive going edge in the $H_{sync}$ signal is detected by the detector 34 within the time interval specified by the window signal, no preset signal is generated and the counter 23 counts recurrently from '0' to 'N−1'.

When a phase jump occurs at the time instant $t_0$ in signal (a) of FIG. 2, the frequency $f_{Hr}$ remains nearly the same, see the signal (b) in FIG. 2, but no $H_{sync}$ pulse occurs at that instant. The counter 23 starts counting from 'zero' at the instant $t_0$ and the sync length counter starts counting from 'zero' at the negative going edge of the $H_{sync}$ signal at the time instant $t_3$. The signals (d) to (h) show, on a time expanded scale, various signals occurring within the time interval following the time instant $t_3$. The signal (d) in FIG. 2 is the clock signal $f_{cl}$ which is applied to the input 21 of the counter 23. The signal (e) in FIG. 2 is the signal $H_{ref}$, and shows the positive going edge at the time instant $t_6$ of the sync pulse $H_{ref}$ that started at $t_3$. The signal (f) in FIG. 2 is the count value of the counter 23 that counts under the influence of the clock pulses $f_{cl}$. The signal (g) of FIG. 2 shows the count value of the sync length counter 32 that also counts under the influence of the clock pulses $f_{cl}$. The signal (h) in FIG. 2 is the preset control signal that occurred at $t_4$. The signal (i) in FIG. 2 is the window signal, which is already absent in the time interval ($t_3,t_6$).

As explained above, the counter 23 started counting from 'zero' at the time instant $t_0$. At the time instant $t_6$, this count value has become '421'. The counter 32 started counting from 'zero' at the time instant $t_3$ at the negative going edge of the pulse $H_{sync}$. At the time instant $t_6$, this count value has become '63'. The pulse $H_{sync}$ occurring at the time instant $t_3$ is thus 64 clock pulses wide, or, substantially 4.7 μs long. As the window signal is absent, the edge in the $H_{sync}$ signal (e) of FIG. 2 results in the generation of the preset signal in the gate 36, see the pulse in the signal (h) at the time instant $t_4$ in FIG. 2. As a result, the value of the sync length counter 32, which is the value '66', is supplied to the input 44, so that the counter 23 can be preset to the count value '66' in response to the occurrence of the preset signal (h) applied to the preset control input 27. Thus, the current count value of the counter 23 at the time instant $t_4$ is replaced by the current count value '66' of the counter 32 at the time instant $t_4$. As a result, the next $H_{ref}$ output signal of the counter 23 will be substantially synchronous with the next $H_{sync}$ pulse at the input terminal 1, resulting in only a small disturbance at the VCO input.

Figure 3:
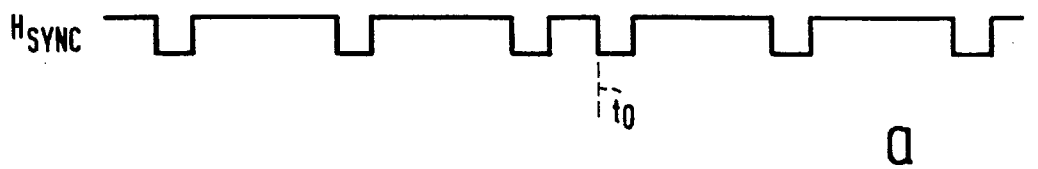
FIG. 3 shows other signals occurring in the device.
Figure 3:
Figure 3:

FIG. 3 shows a situation where the next $H_{sync}$ pulse, that is the $H_{sync}$ pulse occurring at the time instant $t_0$, comes too early. In the same way as described with reference to FIG. 2, the window signal is absent, so that upon detection of the positive going edge of the $H_{sync}$ pulse occurring at $t_0$, a preset control signal is generated, see the signal (c) in FIG. 3. The count value of the counter 32, which will be again a value of substantially '63', is again supplied to the counter 23 and this counter is present with this preset value under the influence of the preset signal supplied to the input 27.

It should be noted that the preset signal may come earlier or later and need not necessarily be generated exactly at the time instant $t_6$ in FIG. 2. If the preset signal is generated at a time instant which is e.g., two clock periods earlier than $t_6$, it will be clear that the preset value '64' will be used and will replace the count value '424 that occurs two clock periods earlier. Further, it will be clear that, in the example as described in FIG. 2, the preset value '66' could have replaced the count value in the counter 23 one clock period earlier, so that it would have replaced the count value '424'.

In a second embodiment, not further described, the sync length counter 32 could have been dispensed with and replaced by a generator for generating a fixed preset value. With the time delay of roughly three clock periods between the time instant $t_6$ of the positive going edge and the time instant $t_4$ of the preset pulse, see FIG. 2, this fixed preset value could be the value '66'.

It should be noted that, although the invention has been described with reference to the derivation of the clock signal from the horizontal line synchronization signal in a videosignal, such as reproduced by a videorecorder, the invention is more widely applicable for deriving the clock signal from any synchronizing signal.

I claim:

1. A device for deriving a clock signal, having a specific frequency, from a synchronizing signal derived from an electrical signal, the device comprising:

an input terminal for receiving the synchronizing signal;

a phase comparator having a first input coupled to the input terminal, a second input, and an output;

a voltage controlled oscillator having an input coupled to the output of the phase comparator, and an output;

preset control signal generator means having an input coupled to the input terminal, and an output for supplying a preset control signal; and counter means having a first input coupled to the output of the voltage controlled oscillator, a second input, coupled to the output of said preset control signal generator means, for receiving said preset control signal, and an output coupled to the second input of the phase comparator, said counter means setting a count value to a preset value in response to the preset control signal, characterized in that the preset control signal generator means comprises:

window signal generator means for determining a window signal in response to a specified count value of the counter means; and detector means, coupled to the window signal generator means, for detecting whether at least one edge in the synchronizing signal falls outside a time interval defined by the window signal, and for generating said preset control signal in response to said detection, said detector means having an input coupled to the input of the preset control signal generator means, and an output coupled to the output of said preset control signal generator means.

2. A device as claimed in claim 1, characterized in that the preset control signal generator means further comprises preset value determining means for generating said preset value which has a relation with the length of an impulse in the synchronizing signal, an output of the preset value determining means being coupled to a preset value input of the counter means.

3. Videorecorder having a device for deriving a clock signal, having a specific frequency, from a synchronizing signal derived from an electrical signal, the device comprising:

an input terminal for receiving the synchronizing signal;

a phase comparator having a first input coupled to the input terminal, a second input, and an output;

a voltage controlled oscillator having an input coupled to the output of the phase comparator, and an output;

preset control signal generator means having an input coupled to the input terminal, and an output for supplying a preset control signal; and counter means having a first input coupled to the output of the voltage controlled oscillator, a second input, coupled to the output of said preset control signal generator means, for receiving said preset control signal, and an output coupled to the second input of the phase comparator, said counter means setting a count value to a preset value in response to the preset control signal, characterized in that the preset control signal generator means comprises:

window signal generator means for determining a window signal in response to a specified count value of the counter means; and detector means, coupled to the window signal generator means, for detecting whether at least one edge in the synchronizing signal falls outside a time interval defined by the window signal, and for generating said preset control signal in response to said detection, said detector means having an input coupled to the input of the preset control signal generator means, and an output coupled to the output of said preset control signal generator means.

4. A videorecorder as claimed in claim 3, characterized in that the preset control signal generator means further comprises preset value determining means for generating said preset value which has a relation with the length of an impulse in the synchronizing signal, an output of the preset value determining means being coupled to a preset value input of the counter means.

\* \* \* \* \*